United States Patent
Kumar et al.

(10) Patent No.: US 12,470,207 B2
(45) Date of Patent: Nov. 11, 2025

(54) SYSTEM AND METHODS FOR OVERSHOOT AND UNDERSHOOT REDUCTION IN PHASE INTERPOLATORS

(71) Applicant: Microchip Technology Incorporated, Chandler, AZ (US)

(72) Inventors: Rapina Siva Kumar, Bengaluru (IN); Ziyu Wang, North Vancouver (CA); Sudheer Babu Ketana, Bangalore (IN)

(73) Assignee: Microchip Technology Incorporated, Chandler, AZ (US)

( * ) Notice: Subject to any disclaimer, the term of this patent is extended or adjusted under 35 U.S.C. 154(b) by 8 days.

(21) Appl. No.: 18/664,643

(22) Filed: May 15, 2024

(65) Prior Publication Data

US 2025/0260396 A1     Aug. 14, 2025

(30) Foreign Application Priority Data

Feb. 9, 2024   (IN) .............................. 202411008976

(51) Int. Cl.
| | | |
|---|---|---|
| *H03K 5/13* | (2014.01) | |
| *H03K 5/131* | (2014.01) | |
| H03K 5/00 | (2006.01) | |
| H03K 19/20 | (2006.01) | |

(52) U.S. Cl.
CPC ... *H03K 5/131* (2013.01); *H03K 2005/00058* (2013.01); *H03K 19/20* (2013.01)

(58) Field of Classification Search
CPC .......... H03K 5/13; H03K 5/131; H03K 5/135; H03K 2005/00013; H03K 2005/00019; H03K 2005/00058; H03K 2005/000286; H03K 19/20; G06F 1/04; G06F 1/12
See application file for complete search history.

(56) References Cited

U.S. PATENT DOCUMENTS

| | | | |
|---|---|---|---|
| 8,067,966 B2 * | 11/2011 | Freyman ................. | H03L 7/087 |
| | | | 327/158 |
| 11,888,486 B2 * | 1/2024 | Jung ........................ | H03K 5/01 |

* cited by examiner

*Primary Examiner* — Long Nguyen
(74) *Attorney, Agent, or Firm* — SLAYDEN GRUBERT BEARD PLLC

(57) ABSTRACT

A phase interpolator may include a decoding logic circuit. The decoding logic circuit may take as input an input control code and an update clock. The decoding logic circuit may generate one or more outputs which may be input to a retiming circuit. The retiming circuit may generate retimed outputs which may be input to a delay modulation circuit. The delay modulation circuit may generate a delayed clock select control signal and a delayed phase select control signal. The delayed clock select control signal and delayed phase select control signal may be input to a phase interpolator circuit and may generate an output clock based on two or more multi-phase input clocks. The delayed clock select control signal and delayed phase select control signal may eliminate overshoot and undershoot events in the output clock.

22 Claims, 9 Drawing Sheets

SYSTEM AND METHODS FOR OVERSHOOT AND UNDERSHOOT REDUCTION IN PHASE INTERPOLATORS

PRIORITY

This application claims priority to commonly owned Indian Provisional Patent Application No. 202411008976 filed Feb. 9, 2024, the entire contents of which are hereby incorporated by reference for all purposes.

FIELD OF THE INVENTION

The present disclosure relates to a system and method for reducing overshoot and undershoot in phase interpolators.

BACKGROUND

Overshoot and undershoot in phase interpolator circuits plays a critical role in receiver design, and overshoot and undershoot are more predominant at clock phase selection boundaries than within individual steps in the phase interpolator.

Existing solutions may solve some issues with overshoot and undershoot, but overshoot and undershoot may still be present when the phase interpolator makes one step, or more than one step, and when the phase select control signal reaches a boundary.

There is a need for circuitry and methods which may reduce overshoot and undershoot events in a phase interpolator and which may protect against overshoot and undershoot when the phase selection is increasing or decreasing by a step size of one, or of more than one, and when the phase select signal reaches a boundary.

SUMMARY

The examples herein enable a system for reducing overshoot and undershoot in a phase interpolator.

According to one aspect, a system includes a decoding logic circuit to receive input from a control code signal and an update clock signal. The decoding logic circuit may generate one or more control signals. The system may include a retiming circuit to receive input from the update clock signal and the one or more control signals. The retiming circuit may generate one or more retimed control signals such that the one or more retimed control signals may be synchronized to the update clock signal. A delay modulation circuit may receive input from the one or more retimed control signals and the update clock signal and may generate a delayed clock select control signal and a delayed phase select control signal. A phase interpolator circuit may receive input from the delayed clock select control signal, the delayed phase select control signal and two or more multi-phase clock signals. The phase interpolator circuit may generate a phase interpolated clock output based on the delayed clock select control signal, the delayed phase select control signal and the two or more multi-phase clock signals.

According to one aspect, a method to reduce overshoot and undershoot in a phase interpolator system may include steps of: receiving a control code and an update clock signal, generating one or more control signals based on the control code and the update clock signal, retiming the one or more control signals based on the update clock signal to generate one or more retimed control signals, delaying the one or more retimed control signals based on the update clock signal and based on a predetermined condition, and generating a delayed clock select control signal and a delayed phase select control signal, and interpolating between two or more multi-phase clock signals, the interpolation based on the delayed clock select control signal and the delayed phase select control signal, the interpolation to generate an interpolated output clock.

DETAILED DESCRIPTION

Figure 1:
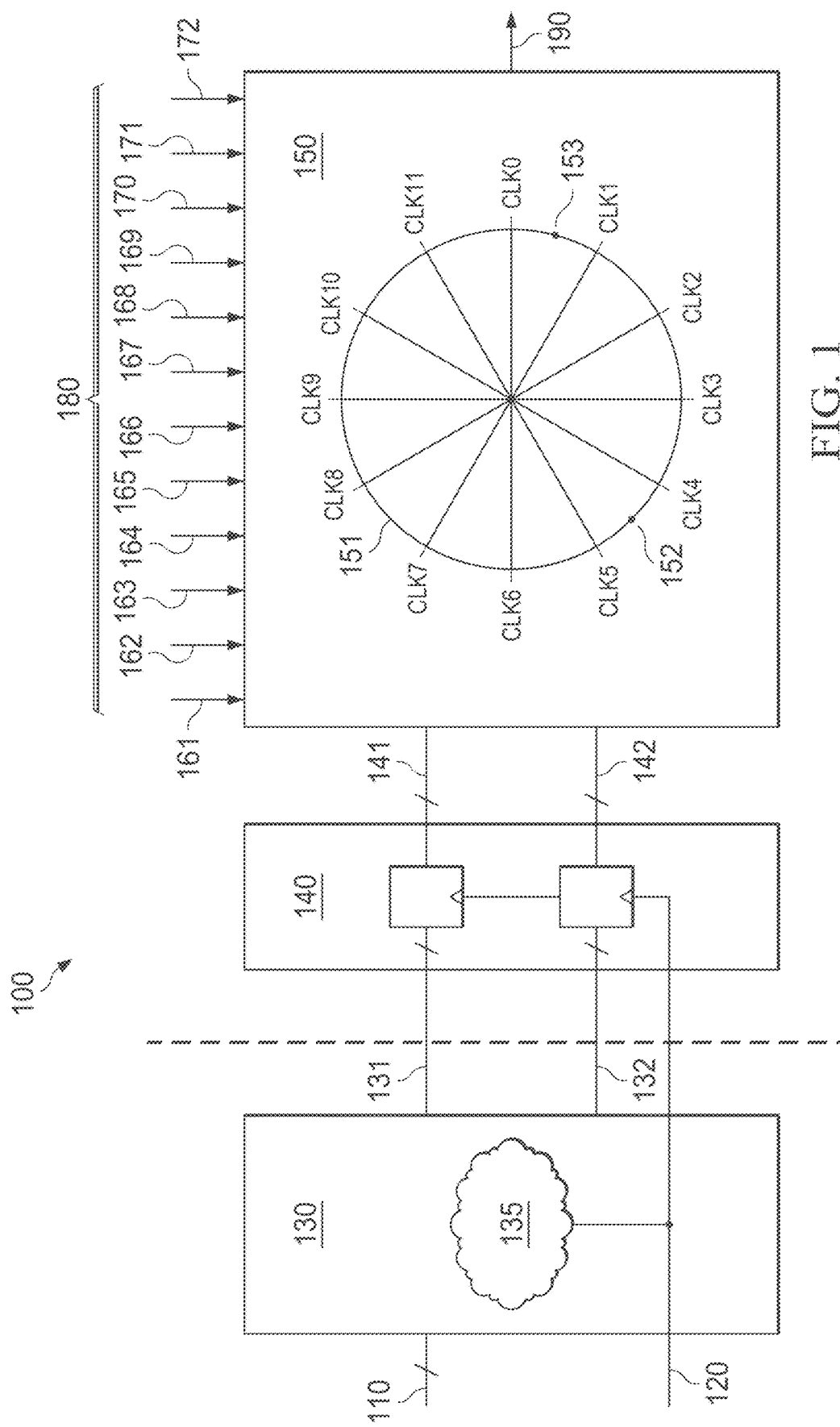
FIG. 1 illustrates one of various examples of a phase interpolator system.

FIG. 1 illustrates one of various examples of phase interpolator system 100.

Phase interpolator system 100 may include control code signal 110 and update clock signal 120. Decoding logic circuit 130 may take as input control code signal 110 and update clock signal 120 and may generate one or more control signals, including clock select control signal 131 and phase select control signal 132. Logic elements 135 may represent combinational and sequential logic elements. Sequential logic elements in logic elements 135 may be clocked by update clock signal 120.

Retiming circuit 140 may take as input clock select control signal 131, phase select control signal 132, and update clock signal 120 and may generate retimed clock select control signal 141 and retimed phase select control signal 142. Retiming circuit 140 may include flip-flops, latches or other sequential logic circuits. Retiming circuit 140 may synchronize clock select control signal 131 and phase select control signal 132 with update clock signal 120 and may output retimed clock select control signal 141 and retimed phase select control signal 142. Retimed clock select control signal 141 and retimed phase select control signal 142 may be synchronized to update clock signal 120. Elements within retiming circuit 140 may be clocked on a rising edge of update clock signal 120 or may be clocked on a falling edge of update clock signal 120.

Phase interpolator circuit 150 may take as input retimed clock select control signal 141, retimed phase select control signal 142 and two or more multi-phase clock signals 180. The example of FIG. 1 is illustrated with 12 multi-phase clock signals 161, 162, 163, 164, 165, 166, 167, 168, 169, 170, 171, and 172 but this is not intended to be limiting. Phase interpolator circuit 150 may generate phase interpolator output 190 based on retimed clock select control signal 141, retimed phase select control signal 142 and the two or more multi-phase clock signals 180.

In phase interpolator circuit 150, multi-phase clock inputs 161, 162, 163, 164, 165, 166, 167, 168, 169, 170, 171, 172 may be also labelled CLK0, CLK1, CLK2, CLK3, CLK4, CLK5, CLK6, CLK7, CLK8, CLK9, CLK10, CLK11, respectively. Phase interpolator circuit 150 may interpolate between two of the multi-phase clock inputs 180. Phase interpolator circuit 150 may select a location on the perimeter of wheel 151 to generate phase interpolator output 190. Wheel 151 is merely for demonstration purposes and is not intended to imply a specific implementation or circuit configuration. Phase interpolator circuit 150 may generate a phase interpolated clock output.

As one of various examples, one setting of retimed clock select control signal 141 and retimed phase select control signal 142 may instruct phase interpolator circuit 150 to interpolate between CLK4 and CLK5 as indicated by location 152. Another setting of retimed clock select control signal 141 and retimed phase select control signal 142 may instruct phase interpolator circuit 150 to interpolate between CLK0 and CLK1 as indicated by location 153.

Phase interpolator output 190 may include glitches, overshoot or undershoot based on the timing relationship between transitions in retimed clock select control signal 141, retimed phase select control signal 142 and update clock signal 120.

Figure 2:
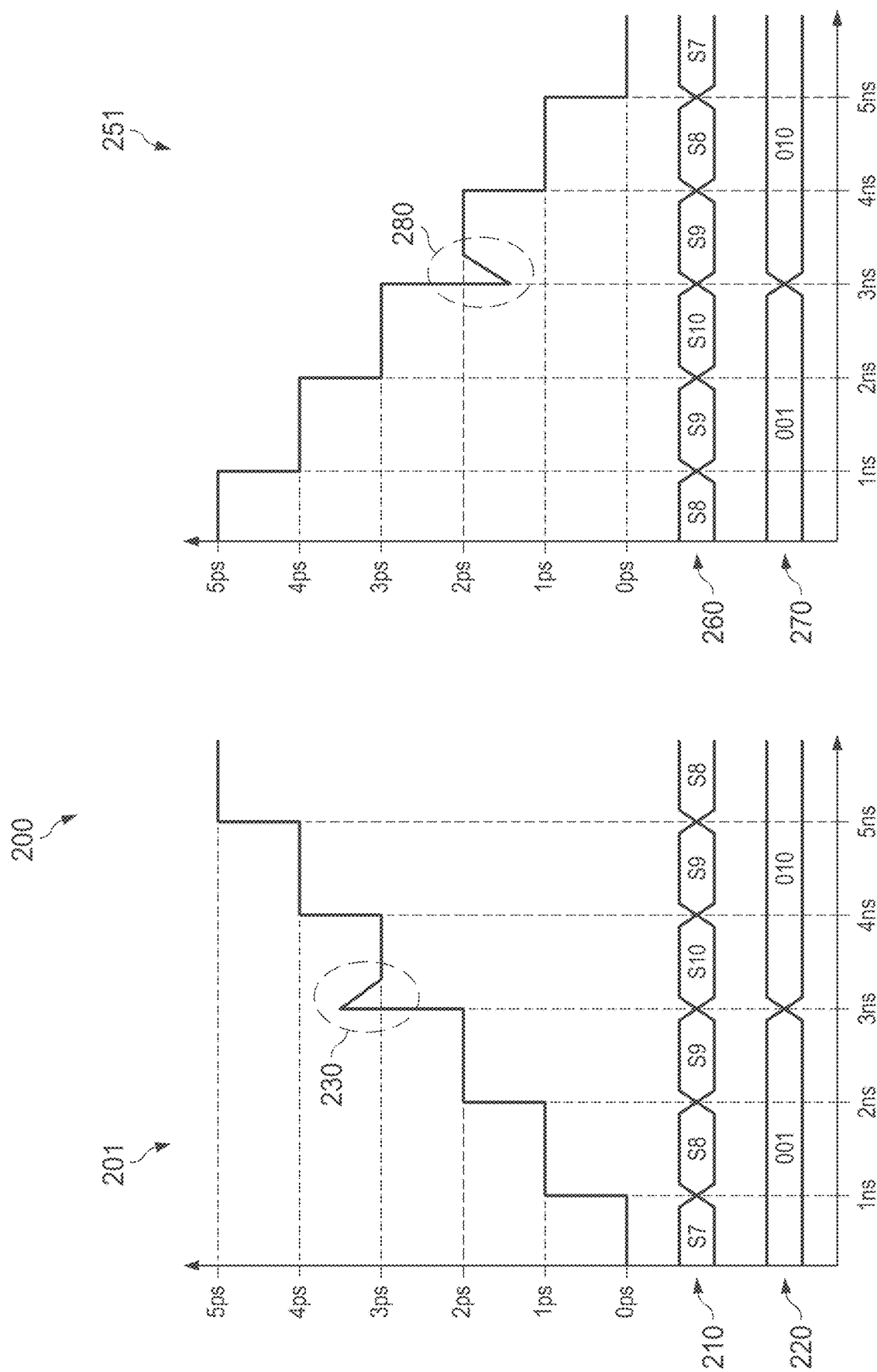
FIG. 2 illustrates one of various examples of overshoot and undershoot in a phase interpolator system.

FIG. 2 illustrates one of various examples of overshoot and undershoot in a phase interpolator system. The example of FIG. 2 may illustrate operation of a phase interpolator system 100 as illustrated in reference to FIG. 1 The example of FIG. 2 may include a retimed clock select control signal 141 and retimed phase select control signal 142 input to phase interpolator circuit 150. Plots 200 may illustrate overshoot and undershoot events in a phase interpolator system. Plot 201 may represent an overshoot during a change in the retimed phase select control signal 142. The y-axis may represent a delay in the phase interpolator output 190, and the x-axis may represent time. The retimed phase select control signal 142 may be represented by trace 210. The retimed clock select control signal 141 may be represented by trace 220. At location 230, a simultaneous change in the retimed phase select control signal 142 of trace 210 and the retimed clock select control signal 141 of trace 220 may introduce a glitch in the phase interpolator output 190. The retimed phase select control signal 142 may change from the S9 setting to the S10 setting at location 230, which represents an increase in the retimed phase select control signal 142. The glitch in the phase interpolator output 190 may be termed an overshoot. Overshoot events may occur due to relative skews across retimed clock select control signal 141 and retimed phase select control signal 142 and may occur due to delays within phase interpolator circuit 150. Skews in retimed phase select control signal 142 relative to multi-phase clock signals 180 may introduce overshoot events.

Plot 251 may represent an undershoot during a change in the retimed phase select control signal 142. The y-axis may represent a delay in the phase interpolator output 190, and the x-axis may represent time. The retimed phase select control signal 142 may be represented by trace 260. The retimed clock select control signal 141 may be represented by trace 270. At location 280, a simultaneous change in the retimed phase select control signal 142 of trace 260 and the retimed clock select control signal 141 of trace 270 may introduce a glitch in the phase interpolator output 190. The retimed phase select control signal 142 may change from the S10 setting to the S9 setting at location 280, representing a decrease in the retimed phase select control signal 142. The glitch in the phase interpolator output 190 may be termed an undershoot. Undershoot events may occur due to relative skews across retimed clock select control signal 141 and retimed phase select control signal 142 and may occur due to delays within phase interpolator circuit 150. Skews in retimed phase select control signal 142 relative to multi-phase clock signals 180 may introduce undershoot events.

The example illustrated in FIG. 2 demonstrates the presence of overshoot and undershoot events during simultaneous transitions in retimed clock select control signal 141 and retimed phase select control signal 142.

Figure 3:
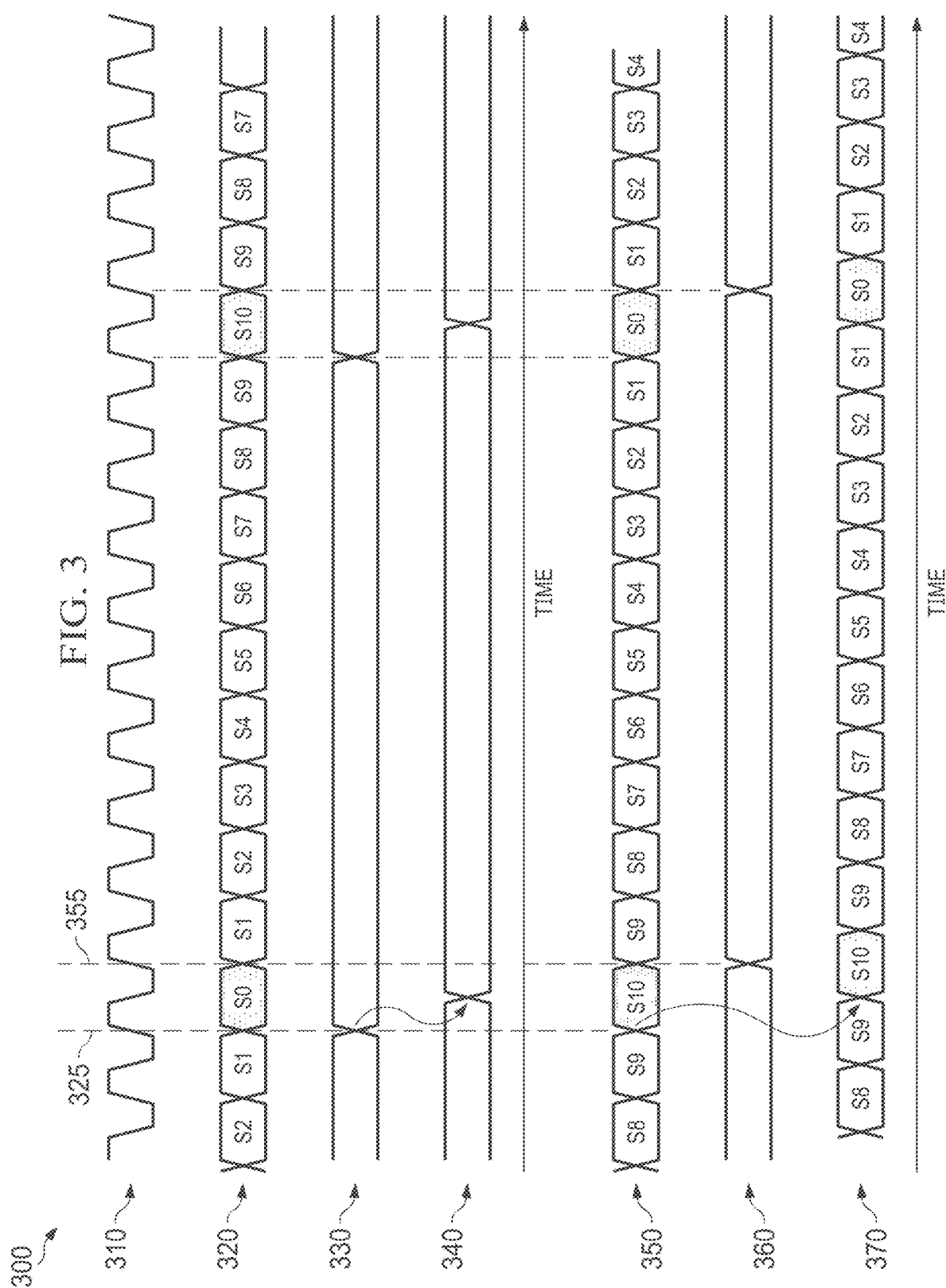
FIG. 3 illustrates an example of introducing delays in control signals to reduce or eliminate overshoot and undershoot events.

FIG. 3 illustrates an example of introducing delays in control signals to reduce or eliminate overshoot and undershoot events. In the example illustrated in FIG. 3, retimed clock select control signal 141 and retimed phase select control signal 142 may be input to phase interpolator circuit 150. One example of a retimed phase select control signal 142 may be represented by trace 320. One example of a retimed clock select control signal 141 may be represented by trace 330. An update clock signal 120 may be represented by trace 310. At location 325, as described in reference to FIG. 2, a change in the retimed phase select control signal 142 of trace 320 and the retimed clock select control signal 141 of trace 330 may introduce a glitch in the phase interpolator output 190. The glitch in the phase interpolator output 190 may be termed an overshoot. Overshoot events may be due to delays between the retimed phase select control signal 142 of trace 320 and the retimed clock select control signal 141 of trace 330. Overshoot may also be due to skew in the update clock signal 120 of trace 310 relative to the retimed phase select control signal 142 of trace 320 and the retimed clock select control signal 141 of trace 330.

Trace 340 may represent a delayed clock select control signal. In one of various examples, trace 340 may be delayed by one-half the period of update clock signal 120 of trace 310, as illustrated in FIG. 3, without limitation. In other examples, trace 340 may be delayed by a different amount of time. The delayed clock select control signal of trace 340 may be input to phase interpolator circuit 150 and may prevent overshoot and undershoot events. The delayed clock select control signal as represented by trace 340 may eliminate glitches in the phase interpolator output based upon the half-cycle delay between the transition of retimed phase select control signal 142 of trace 320 and delayed clock select control signal of trace 340.

Trace 350 may represent another example of retimed phase select control signal 142. A retimed clock select control signal 141 may be represented by trace 360. A retimed phase select control signal 142 may be represented by trace 350. At location 355, as described in reference to FIG. 2, a change in the retimed phase select control signal of trace 350 and the retimed clock select control signal of trace 360 may introduce a glitch in the phase interpolator output 190. The glitch in the phase interpolator output 190 may be termed an undershoot. Undershoot events may be due to delays between the retimed phase select control signal 142 of trace 350 and the retimed clock select control signal 141 of trace 360. Undershoot may also be due to skew in an update clock signal 120 of trace 310 relative to the retimed phase select control signal 142 of trace 320 and the retimed clock select control signal 141 of trace 330.

Trace 370 may represent a delayed phase select control signal. Trace 370 may be delayed by one-half period of update clock signal 120 without limitation. In other examples, trace 370 may be delayed by a different amount of time. The delayed phase select control signal of trace 370 and the retimed clock select control signal 141 of trace 360 may be input to phase interpolator circuit 150 and may eliminate overshoot and undershoot based on the delay between trace 360 and trace 370.

Figure 4:
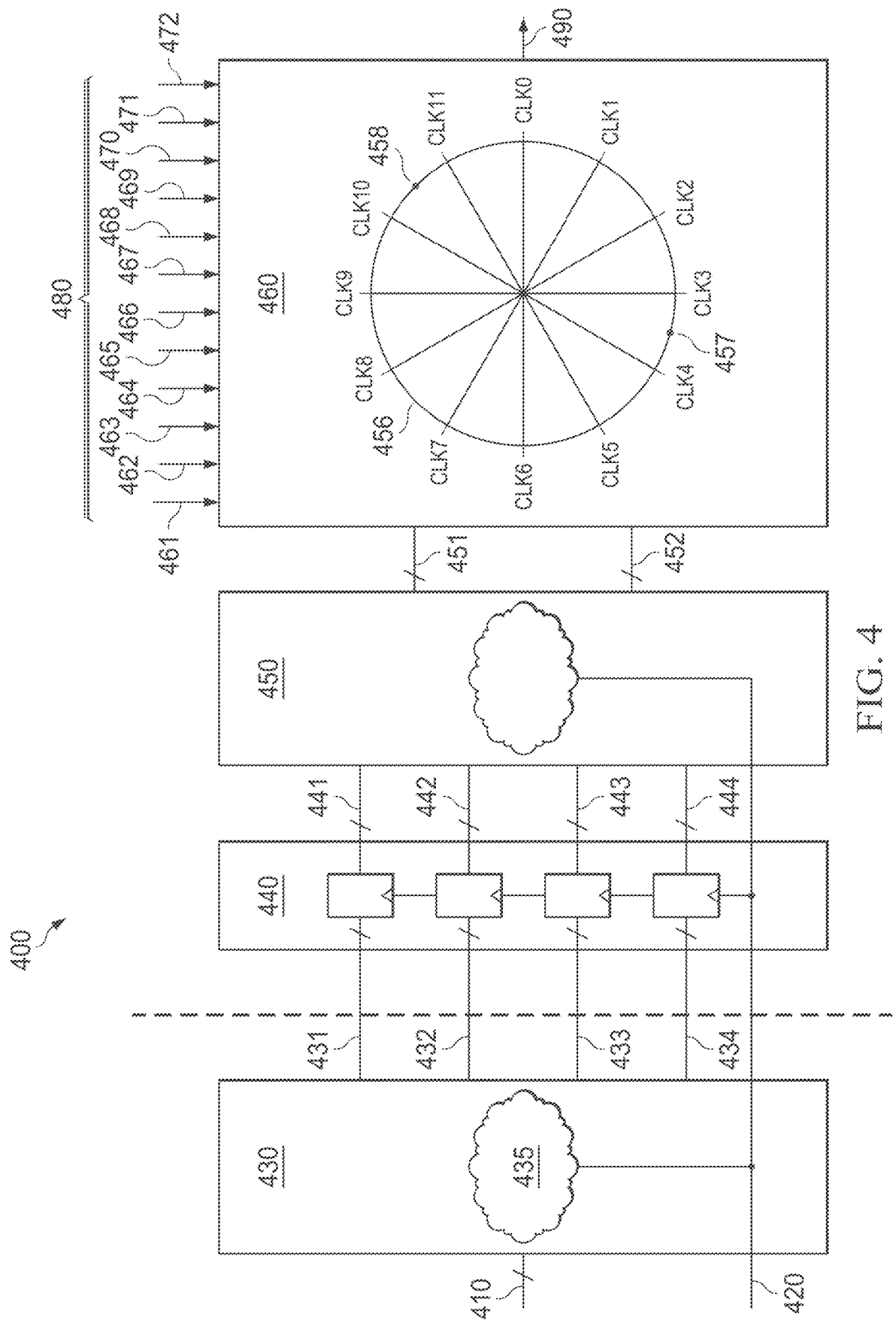
FIG. 4 illustrates one of various examples of a phase interpolator system with a delay modulation circuit.

FIG. 4 illustrates one of various examples of a phase interpolator system 400 with delay modulation circuit 450. Delay modulation circuit 450 may implement the delays of trace 340 and trace 370 as described and illustrated in reference to FIG. 3 and may reduce or eliminate overshoot and undershoot events in a phase interpolator. Delay modulation circuit 450 may control delays in delayed clock select control signal 451 and delayed phase select control signal 452.

Phase interpolator system 400 may include control code signal 410 and update clock signal 420. Decoding logic circuit 430 may take as input control code signal 410 and update clock signal 420 and may generate clock select control signal 431, phase select control signal 432, direction signal 433 and step size signal 434. A first polarity of step size signal 434 may represent a step size of one, and a second polarity of step size signal 434 may represent a step size greater than one. Logic elements 435 may represent combinational and sequential logic elements. Sequential logic elements in logic elements 435 may be clocked by update clock signal 420. Logic elements 435 may generate one or more of clock select control signal 431, phase select control signal 432, direction signal 433 and step size signal 434. A first polarity of direction signal 433 may indicate an increase in the value of the phase select control signal 432. A second polarity of direction signal 433 may indicate a decrease in the value of the phase select control signal 432. Retiming circuit 440 may take as input clock select control signal 431, phase select control signal 432, direction signal 433 and step size signal 434 and may generate retimed clock select control signal 441, retimed phase select control signal 442, retimed direction signal 443 and retimed step size signal 444.

Delay modulation circuit 450 may take as input retimed clock select control signal 441, retimed phase select control signal 442, retimed direction signal 443 and retimed step size signal 444 and may generate delayed clock select control signal 451 and delayed phase select control signal 452. Delayed phase select control signal 452 may also be termed a retimed blender switching control signal.

In operation, delay modulation circuit 450 may introduce a delay in one of the retimed clock select control signal 441 or the retimed phase select control signal 442, to produce the delayed clock select control signal 451 and the delayed phase select control signal 452, the delay based on the retimed direction signal 443 and the retimed step size signal 444. In one of various examples, delay modulation circuit 450 may delay the retimed clock select control signal 441 by one-half period of the update clock signal 420, to produce the delayed clock select control signal 451, based on a first polarity of the retimed direction signal 443. In one of various examples, delay modulation circuit 450 may delay the retimed phase select control signal 442 by one-half period of the update clock signal 420, to produce the delayed phase select control signal 452, based on a second polarity of the retimed direction signal 443.

Phase interpolator circuit 460 may take as input delayed clock select control signal 451 and delayed phase select control signal 452 and two or more multi-phase clock signals 480. The example of FIG. 4 is illustrated with 12 multi-phase clock signals 461, 462, 463, 464, 465, 466, 467, 468, 469, and 470, 471, 472 but this is not intended to be limiting. Phase interpolator circuit 460 may generate phase interpolator output 490 based on delayed clock select control signal 451, delayed phase select control signal 452 and the two or more multi-phase clock signals 480.

Phase interpolator circuit 460 may interpolate between two of the multi-phase clock inputs 480. Phase interpolator circuit 460 may select a location on the perimeter of wheel 456 to generate phase interpolator output 490. Wheel 456 is merely for demonstration purposes, and is not intended to imply a specific implementation or circuit configuration.

As one of various examples, one setting of delayed clock select control signal 451 and delayed phase select control signal 452 may instruct phase interpolator circuit 460 to interpolate between CLK3 and CLK4 as indicated by location 457. Another setting of delayed clock select control signal 451 and delayed phase select control signal 452 may instruct phase interpolator circuit 460 to interpolate between CLK10 and CLK11 as indicated by location 458.

The example of FIG. 4 illustrates a separate retiming circuit 440 and delay modulation circuit 450, but this is not intended to be limiting. In other examples, delay modulation circuit 450 may include retiming circuit 440 and together delay modulation circuit 450 and retiming circuit 440 may comprise a single element.

Figure 5:
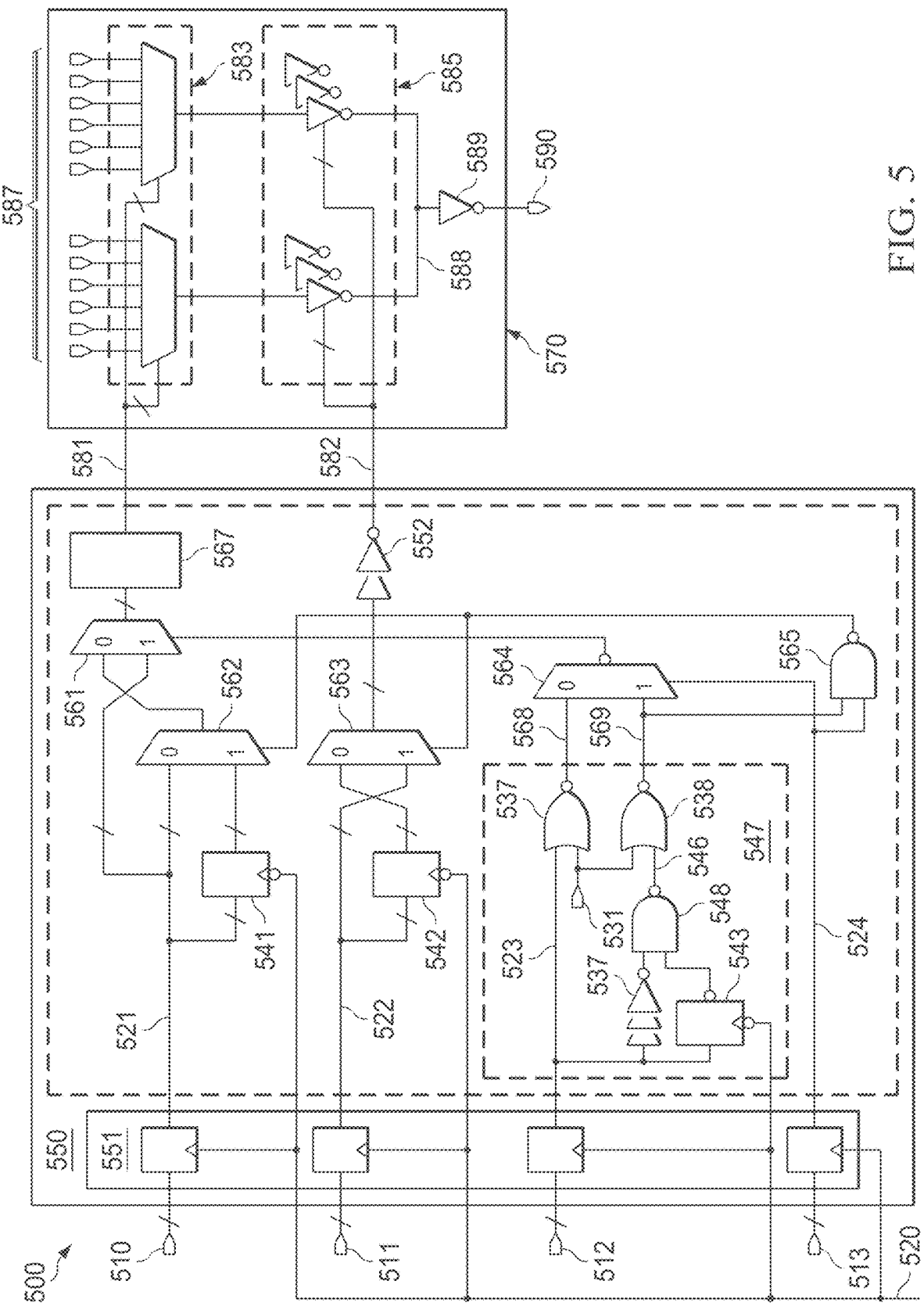
FIG. 5 illustrates one of various examples of a phase interpolator output circuit including a delay modulation circuit.

FIG. 5 illustrates one of various examples of a phase interpolator output circuit including a delay modulation circuit 500. Phase interpolator system 500 may include inputs of clock select control signal 510, phase select control signal 511, step size signal 512, direction signal 513 and update clock signal 520.

Clock select control signal 510, phase select control signal 511, step size signal 512, direction signal 513, and update clock signal 520 may be input to delay modulation circuit 550. Delay modulation circuit 550 may produce delayed clock select control signal 581 and delayed phase select control signal 582.

In one of various examples, delay modulation circuit 550 may include retiming circuit 551. In other examples, delay modulation circuit 550 and retiming circuit 551 may comprise separate elements. Retiming circuit 551 may generate retimed clock select control signal 521. Retimed clock select control signal 521 may be synchronous with update clock signal 520. In other examples, retiming circuit 551 may be separate from delay modulation circuit 550.

Sequential logic circuit 541 may introduce a half-period delay in retimed clock select control signal 521 based on the period of update clock signal 520. Retimed clock select control signal 521 may be a first input of multiplexer 562. The output of sequential logic circuit 541 may be input to a second input of multiplexer 562. Multiplexer 562 may select an output based on the output of logic gate 565.

The output of multiplexer 562 may be coupled to a first input of multiplexer 561. Retimed clock select control signal 521 may be coupled to a second input of multiplexer 561. Multiplexer 561 may select an output based on the output of inverting multiplexer 564. In the non-limiting example shown, multiplexer 561 may output retimed clock select control signal 521 in response to a 1, or logic high level, output of inverting multiplexer 564, and the output of multiplexer 562 in response to a 0, or logic low level, output of inverting multiplexer 564.

Retiming circuit 551 may generate retimed phase select control signal 522. Retimed phase select control signal 522 may be synchronous with update clock signal 520.

Sequential logic circuit 542 may introduce a half-period delay in retimed phase select control signal 522 based on the period of update clock signal 520. The output of sequential logic circuit 542 may be input to a first input of multiplexer 563. Retimed phase select control signal 522 may be coupled to a second input of multiplexer 563. Multiplexer 563 may select an output based on the output of logic gate 565.

In operation, when the output of logic gate 565 is a logic high value, multiplexer 562 may select the half-period delayed output of sequential logic gate 541, and multiplexer 563 may select retimed phase select control signal 522. In operation, when the output of logic gate 565 is a logic low value, multiplexer 562 may select retimed clock select control signal 521, and multiplexer 563 may select the half-period delayed output of sequential logic gate 542.

In this manner, delay modulation circuit 550 may delay one of retimed clock select control signal 521 and retimed phase select control signal 522.

Retiming circuit 551 may generate retimed step size signal 523. Retimed step size signal 523 may be synchronous with update clock signal 520.

Logic circuit 547 may generate a forward step signal 568 and a reverse step signal 569. Inverter chain 537, sequential logic circuit 543 and logic gate 548 may generate a pulse signal 546 when retimed step size signal 523 changes state. Bypass signal 531 and pulse signal 546 may be input to logic gate 538. A logic high value on bypass signal 531 may force the output of logic gate 538 to a logic low output at reverse step signal 569. Bypass signal 531 and retimed step size signal 523 may be input to logic gate 537. A logic high value on bypass signal 531 may force the output of logic gate 537 to a logic low output at forward step signal 568. In this manner, a logic high value on bypass signal 531 may force a logic high output of inverting multiplexer 564, which may force multiplexer 561 to output retimed clock select control signal 521 and may bypass any delayed clock select signal output by multiplexer 562.

Retiming circuit 551 may generate retimed direction signal 524. Retimed direction signal 524 may be synchronous with update clock signal 520. Reverse step signal 569 may be input to a first input of logic gate 565, and retimed direction signal 524 may be input to a second input of logic gate 565. In operation, when retimed direction signal 524 is logic low and reverse step signal 569 is logic low, logic gate 565 may output a logic high signal, and multiplexer 562 may output a half-period delayed version of retimed clock select control signal 521. The half-period delayed version of retimed clock select control signal 521 may be one of various examples of delayed clock select control signal 451 as described and illustrated in reference to FIG. 4. Multiplexer 563 may output retimed phase select control signal 522. In this manner, retimed step size signal 523 and retimed direction signal 524 may selectively delay one of retimed clock select control signal 521 and retimed phase select control signal 522.

Encoder circuit 567 may encode the output of multiplexer 561 and may output clock multiplexer select signal 581. Encoder circuit 567 may implement a grey code or may implement another encoding scheme.

Clock multiplexers 583, phase selector 585, and buffer 589 may comprise phase interpolator circuit 570.

Clock multiplexer select signal 581 may be input to phase interpolator circuit 570. Clock multiplexers 583 may select two of multi-phase clock signals 587. Buffer 552 may be coupled to the output of multiplexer 563 and may generate delayed phase select control signal 582. The outputs of clock multiplexers 583 and the delayed phase select control signal 582 may be input to phase selector 585. Outputs 588 of phase selector 585 may be input to buffer 589. The output of buffer 589 may comprise phase interpolator output 590.

Clock multiplexer select signal 581 may also be termed delayed clock select control signal. In operation, phase interpolator system 500 may generate delays in delayed clock select control signal 581 and delayed phase select control signal 582 which may reduce or eliminate overshoot and undershoot in phase interpolator output 590.

Delay modulation circuit 550 may eliminate overshoot and undershoot events when a retimed phase select control signal may be changing by a value of one. In the example illustrated in FIG. 2, an overshoot event may be introduced at location 230 during a change in trace 210 of a value of one, specifically from the S9 setting to the S10 setting. Use of delay modulation circuit 550 may eliminate the overshoot event at location 230. In the example illustrated in FIG. 2, an undershoot event may be introduced at location 280 during a change in trace 260 of a value of one, specifically from the S10 setting to the S9 setting. Use of delay modulation circuit 550 may eliminate the undershoot event at location 280.

Figure 6:
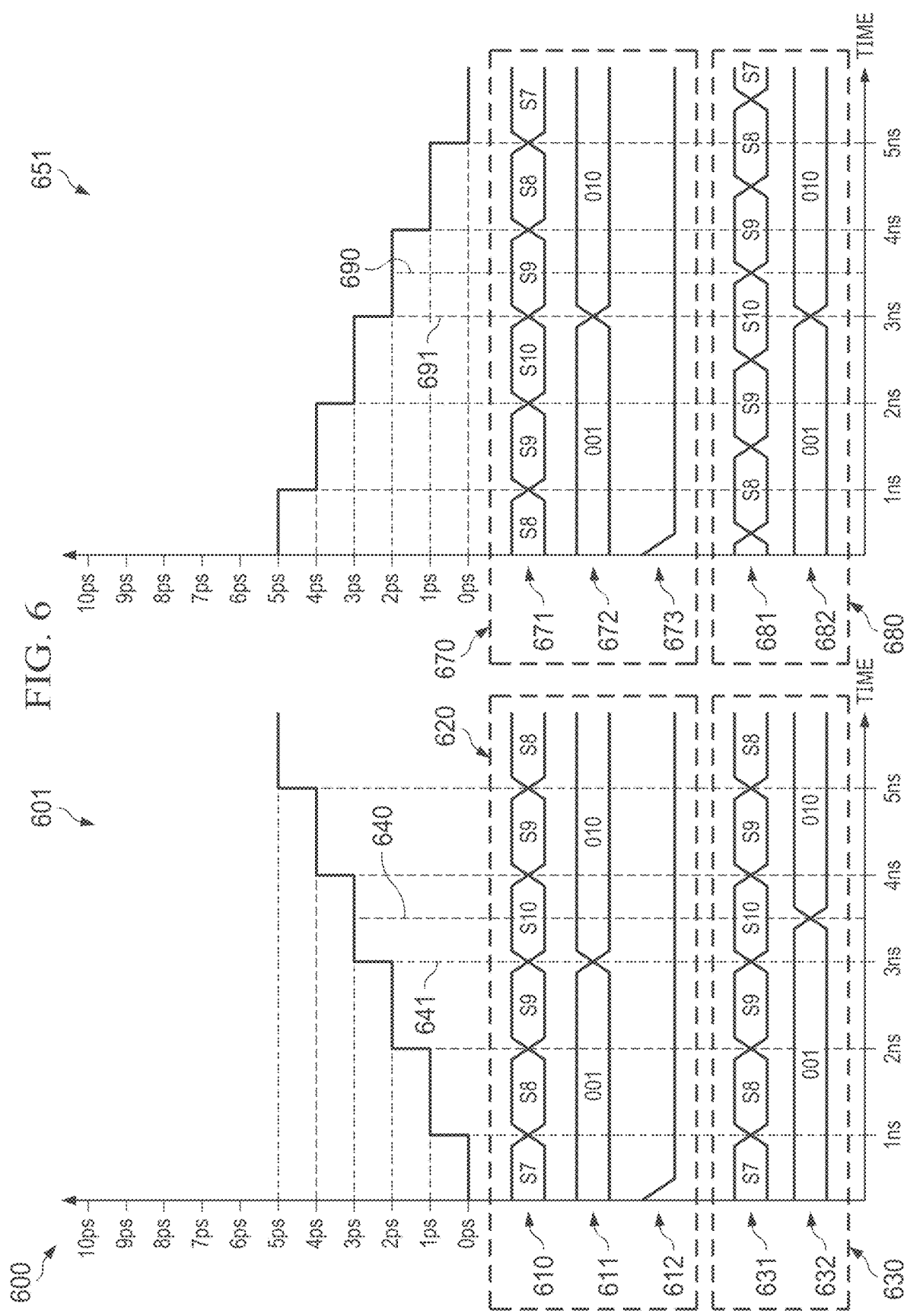
FIG. 6 illustrates one of various examples of eliminating overshoot in a phase interpolator system.

FIG. 6 illustrates one of various examples of eliminating overshoot in a phase interpolator system. Plot 601 may represent one example eliminating overshoot. Signals 620 may represent inputs to a delay modulation circuit as described and illustrated in reference to FIG. 5. Signals 630 may represent outputs of a delay modulation circuit as described and illustrated in reference to FIG. 5. An increasing phase select control signal may be represented by trace 610. A clock select control signal may be represented by trace 611. A step size signal may be represented by trace 612. Step size signal represented by trace 612 may not change during the time period of plot 601 and may represent a fixed step size of one. In other examples, the step size may be fixed at a value greater than or equal to one. Phase select control signal 610 and clock select control signal 611 may transition at time 641. A delay modulation circuit as described and illustrated in reference to FIG. 5 may delay clock select control signal 611 to generate delayed clock select control signal 632. Phase select control signal 610 may be unchanged and may comprise delayed phase select control signal 631. A glitch may be eliminated at location 640 based on the delay in delayed clock select control signal 632.

Plot 651 may represent an example eliminating an undershoot event. Signals 670 may represent inputs to a delay modulation circuit as described and illustrated in reference to FIG. 5. Signals 680 may represent outputs of a delay modulation circuit as described and illustrated in reference to FIG. 5. A phase select control signal may be represented by trace 671. A clock select control signal may be represented by trace 672. A step size signal may be represented by trace 673. Step size signal represented by trace 673 may not change during the time period of plot 651 and may represent a fixed step size of one. In other examples, the step size may be fixed at a value greater than or equal to one. Phase select control signal 671 and clock select control signal 672 may transition at time 691. A delay modulation circuit as described and illustrated in reference to FIG. 5 may delay phase select control signal 671 to generate delayed phase select control signal 681. Clock select control signal 672 may be unchanged and may comprise delayed clock select control signal 682. A glitch may be eliminated at location 691 based on the delay in delayed phase select control signal 681.

Figure 7:
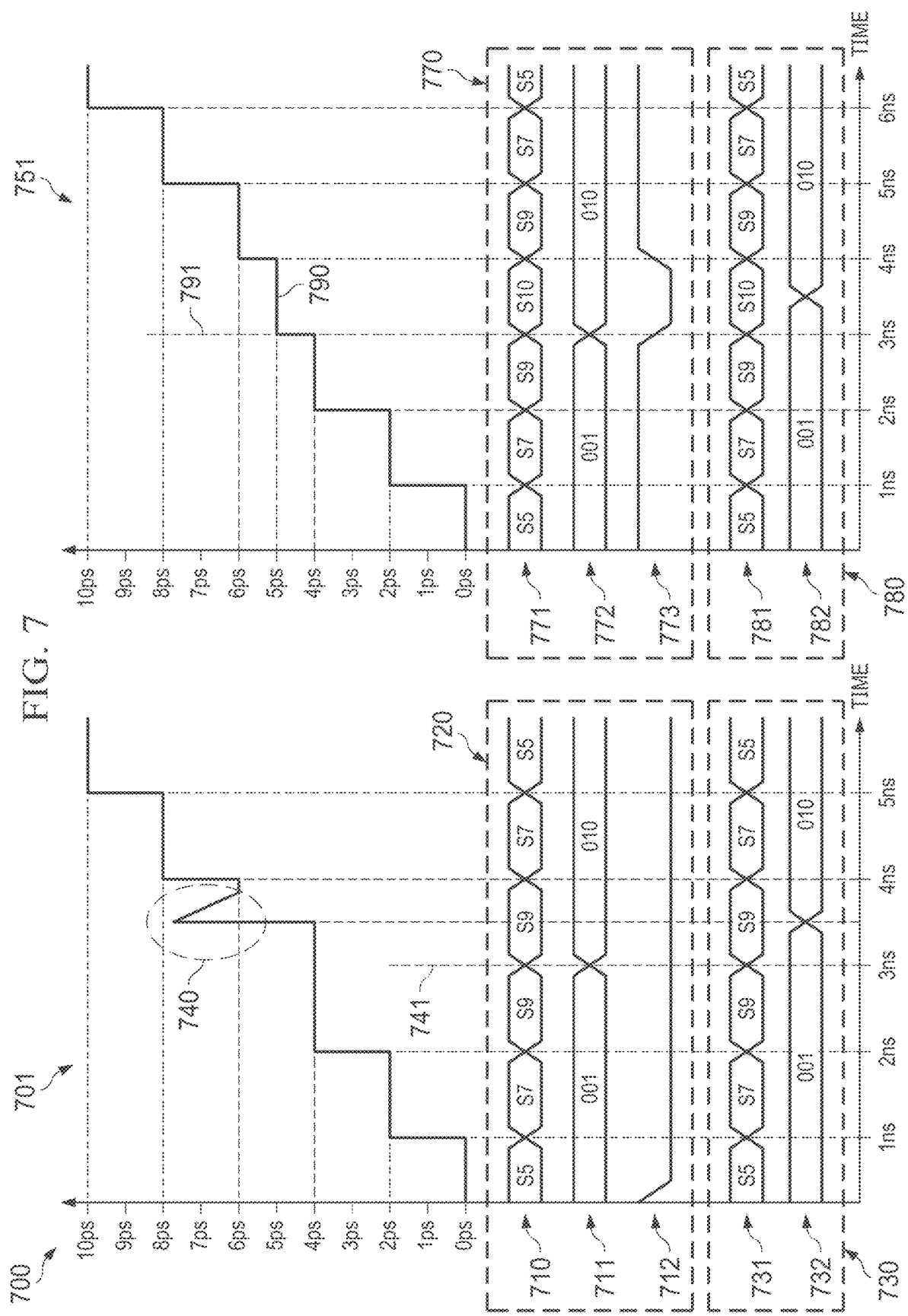
FIG. 7 illustrates an example of eliminating overshoot in a phase interpolator system at a boundary.

FIG. 7 illustrates an example of eliminating overshoot in a phase interpolator system at a boundary. The boundary may be defined as exceeding the maximum or minimum of the range of the phase select control signal. In the example illustrated in FIG. 7, the phase select control signal may range from a minimum setting of S0 to a maximum setting of S10. Plots 700 may represent an overshoot event. Signals 720 may represent inputs to a delay modulation circuit as described and illustrated in reference to FIG. 5. Signals 730 may represent outputs of a delay modulation circuit as described and illustrated in reference to FIG. 5. Plot 701 may represent an overshoot event with a phase select control signal increasing by two at each step without boundary protection. An increasing phase select control signal may be represented by trace 710. A clock select control signal may be represented by trace 711. A step size signal may be represented by trace 712. Step size signal represented by trace 712 may not change during the time period of plot 701 and may represent a fixed step size of two. In other examples, the step size may be fixed at a value greater than or equal to two. Phase select control signal 710 and clock select control signal 711 may transition at time 741. A delay modulation circuit as described and illustrated in reference to FIG. 5 may delay clock select control signal 711 to generate delayed clock select control signal 732. Phase select control signal 710 may be unchanged and may comprise delayed phase select control signal 731. A glitch may be introduced at location 740 based on the phase select code changing with a step size of two and the phase select control signal 710 crossing the boundary. Phase select control signal 710 crosses a boundary because the phase select control signal 710 is set to S9, and a change by a value of two skips the value of S10 and returns to the S9 state. This example may illustrate crossing a boundary at a maximum value. In a similar manner, a boundary may be crossed at a minimum level of S0. The phase select control signal 710 is at a setting of S9, skips the boundary level of S10, and the phase select control signal 710 returns to the S9 setting and a glitch may be introduced at location 740. The operation of phase select control signal in this example 710 may be termed reaching a boundary.

Plot 751 may represent elimination of an overshoot event with boundary protection. Signals 770 may represent inputs to a delay modulation circuit as described and illustrated in reference to FIG. 5. Signals 780 may represent outputs of a delay modulation circuit as described and illustrated in reference to FIG. 5. A phase select control signal may be represented by trace 771. A clock select control signal may be represented by trace 772. A step size signal may be represented by trace 773. A value of logic low of step size signal represented by trace 773 may indicate a step size of one, and a value of logic high of step size signal represented by trace 773 may indicate a step size greater than one. Phase select control signal 771 and clock select control signal 772 may transition at time 791. A delay modulation circuit as described and illustrated in reference to FIG. 5 may delay clock select control signal 772 to generate delayed clock select control signal 782. Phase select control signal 771 may be unchanged and may comprise delayed phase select control signal 781. Step size signal 773 may be modified at time 791 and may transition from a logic high value to a logic low value. A logic low value of step size signal 773 may indicate a step size of one and may produce a transition from the S9 setting to the S10 setting in phase select control signal 771. As the phase select control signal 771 transitions by only a signal step, from S9 to S10, and a dynamic half-cycle delay is added at trace 772 to generate trace 782, a glitch may be avoided in the phase interpolator output at location 790.

Step size signal 773 may be modified dynamically to allow only a step size of one when phase select control signal 771 exceeds the maximum value of phase select control signal 771. The dynamic change of trace 773 may lead to addition of a half-cycle delay in trace 782.

The specific values (S5, S7, S9, S10) of the phase select control signal represented by trace 710 and of the clock select control signal (001, 010) represented by trace 711 are merely for demonstration purposes and are not intended to be limiting. The specific values (S5, S7, S9, S10) of the phase select control signal represented by trace 771 and of the clock select control signal (001, 010) represented by trace 772 are merely for demonstration purposes and are not intended to be limiting.

Figure 8:
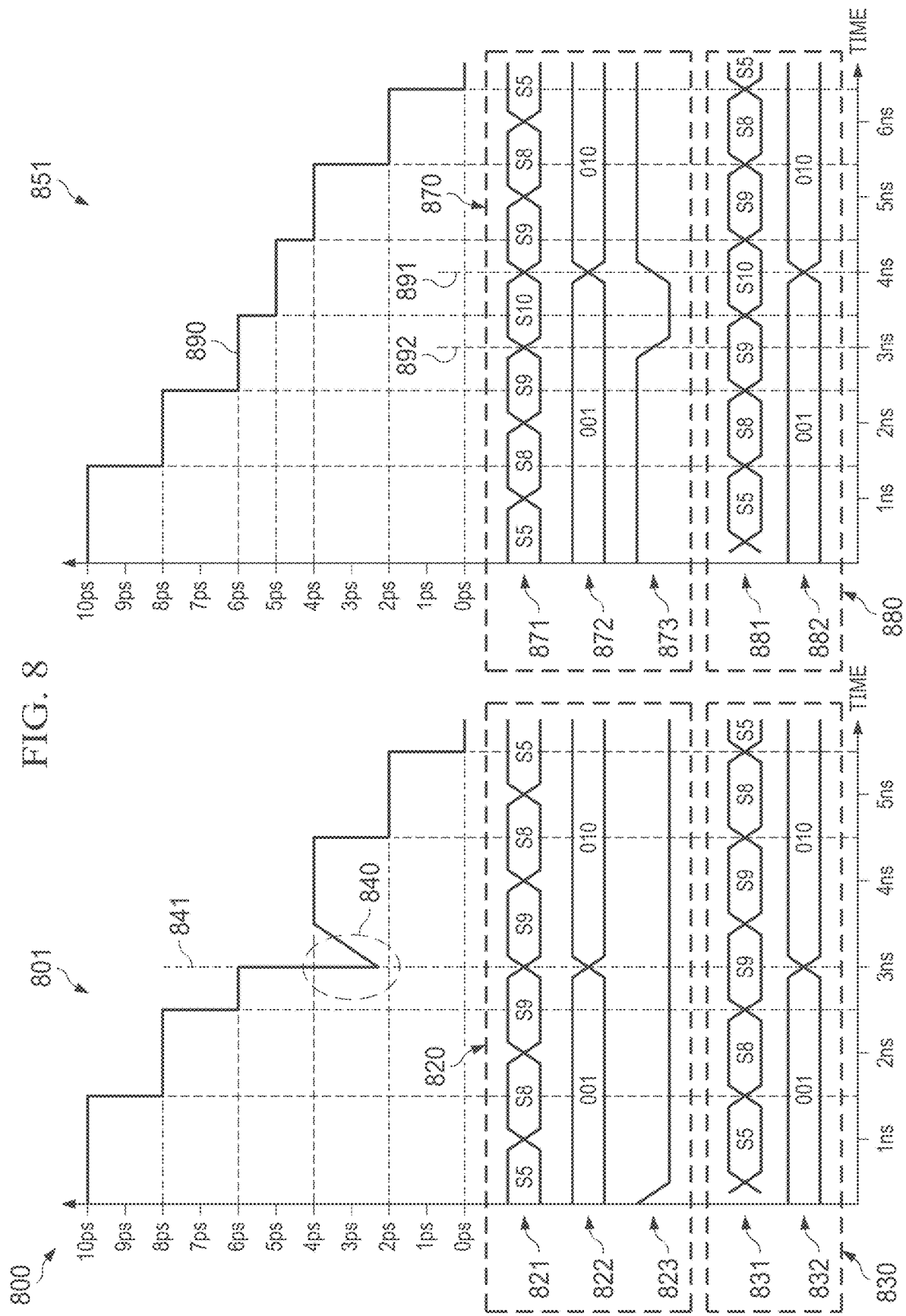
FIG. 8 illustrates an example of eliminating undershoot in a phase interpolator system at a boundary.

FIG. 8 illustrates an example of eliminating undershoot in a phase interpolator system at a boundary. In the example illustrated in FIG. 8, the phase select control signal may range from a minimum setting of S0 to a maximum setting of S10. Plots 800 may represent an undershoot event. Signals 820 may represent inputs to a delay modulation circuit as described and illustrated in reference to FIG. 5. Signals 830 may represent outputs of a delay modulation circuit as described and illustrated in reference to FIG. 5. Plot 801 may represent an undershoot event with a phase select control signal decreasing by two at each step. A phase select control signal may be represented by trace 821. A clock select control signal may be represented by trace 822. A step size signal may be represented by trace 823. The step size signal represented by trace 823 may not change during the duration of plot 801 and may represent a change in the phase select control signal 821 of two at each step. Phase select control signal 821 and clock select control signal 822 may transition at time 841. A delay modulation circuit as described and illustrated in reference to FIG. 5 may delay phase select control signal 821 to generate delayed phase select control signal 831. Clock select control signal 821 may be unchanged and may comprise delayed clock select control signal 832. A glitch may be introduced at location 840 based on the phase select control signal changing and the phase select control signal 821 crossing the boundary. The phase select control signal 821 is at a setting of S9, and a change in a value of two results in the value crossing the boundary and returning to the S9 setting. The phase select control signal 821 remains at the S9 setting and a glitch may be introduced at location 840. Undershoot may be observed as phase select control signal 821 does not reach the boundary setting S10 but crosses the boundary and returns to the S9 state.

Plot 851 may represent prevention of an undershoot event with boundary protection for a phase select control signal decreasing by two at each step. Signals 870 may represent inputs to a delay modulation circuit as described and illustrated in reference to FIG. 5. Signals 880 may represent outputs of a delay modulation circuit as described and illustrated in reference to FIG. 5. A phase select control signal may be represented by trace 871. A clock select control signal may be represented by trace 872. A step size signal may be represented by trace 873. Phase select control signal 871 and clock select control signal 872 may transition at time 891. A delay modulation circuit as described and illustrated in reference to FIG. 5 may delay phase select control signal 871 to generate delayed phase select control signal 881. Clock select control signal 872 may be unchanged and may comprise delayed clock select control signal 882. Step size signal 873 may be modified at time 892 and may transition from a logic high value to a logic low value. A logic low value of step size signal 873 may indicate a change of one step and may produce a transition from the S9 setting to the S10 setting in phase select control signal 771. As the phase select control signal 871 transitions by only a signal step, from S9 to S10, a glitch may be avoided in the phase interpolator output at location 890. Delayed phase select control signal 881 may be generated based on the retimed phase select control signal reaching or exceeding a maximum value. Delayed phase select control signal 881 may be generated based on the retimed phase select control signal reaching or exceeding a minimum value.

Figure 9:
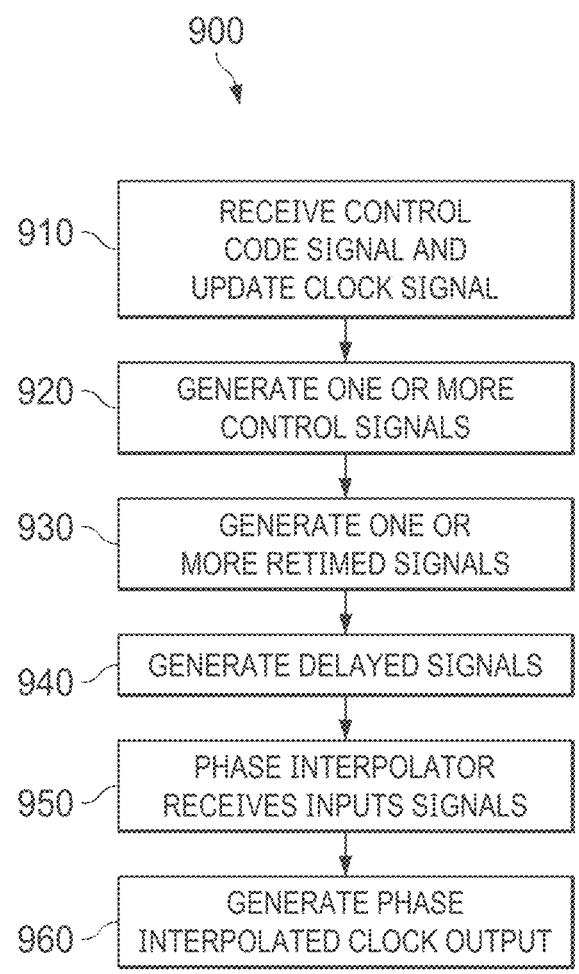
FIG. 9 illustrates a method of reducing overshoot and undershoot in a phase interpolator system.

FIG. 9 illustrates a method of reducing overshoot and undershoot in a phase interpolator system.

At operation 910, a decoding logic circuit may receive input from a control code signal and an update clock signal.

At operation 920, the decoding logic circuit may generate one or more control signals.

At operation 930, a retiming circuit may receive input from the one or more control signals and may generate one or more retimed signals.

At operation 940, a delay modulation circuit may receive input from the one or more retimed output signals and may generate one or more delayed signals, including but not limited to a delayed clock select control signal and a delayed phase select control signal. The delayed clock select control signal may be based on a retimed phase select control signal reaching a boundary. The delayed phase select control signal may be based on the retimed phase select control signal reaching a boundary. A boundary may be defined as the retimed phase select control signal reaching or exceeding the maximum value of the retimed phase select control signal or the retimed phase select control signal reaching or exceeding the minimum value of the retimed phase select control signal.

At operation 950, a phase interpolator may receive input from the delayed clock select control signal, the delayed phase select control signal and one or more multi-phase clock signals.

At operation 960, the phase interpolator may generate a phase interpolated clock output based on the delayed clock select control signal, the delayed phase select control signal, and the one or more multi-phase clock signals.

We claim:

1. A system comprising:
   a decoding logic circuit to receive input from a control code signal and an update clock signal and to generate one or more control signals;
   a retiming circuit to receive input from the update clock signal and the one or more control signals and to generate one or more retimed control signals, the one or more retimed control signals synchronized to the update clock signal;
   a delay modulation circuit to receive input from the one or more retimed control signals and the update clock signal and to generate a delayed clock select control signal and a delayed phase select control signal; and
   a phase interpolator circuit to receive input from the delayed clock select control signal, the delayed phase select control signal and two or more multi-phase clock signals, and to generate a phase interpolated clock output based on the delayed clock select control signal, the delayed phase select control signal and the two or more multi-phase clock signals.

2. The system as claimed in claim 1, the one or more control signals comprising a clock select control signal, a phase select control signal, a direction signal and a step size signal.

3. The system as claimed in claim 2, the one or more retimed control signals comprising a retimed clock select control signal, a retimed phase select control signal, a retimed direction signal and a retimed step size signal.

4. The system as claimed in claim 3, the delay modulation circuit to, based on a polarity of the retimed direction signal, delay the retimed clock select control signal by one-half of the period of the update clock signal to generate the delayed clock select control signal.

5. The system as claimed in claim 4, the delay modulation circuit to delay a transition in the retimed clock select control signal by one-half of the period of the update clock signal based on the retimed phase select control signal crossing a boundary, to generate the delayed clock select control signal.

6. The system as claimed in claim 3, the delay modulation circuit to delay the retimed clock select control signal based on a first polarity of the retimed direction signal, to generate the delayed clock select control signal.

7. The system as claimed in claim 3, the delay modulation circuit to, based on a polarity of the retimed direction signal, delay the retimed phase select control signal by one-half of the period of the update clock signal to generate the delayed phase select control signal.

8. The system as claimed in claim 7, the delay modulation circuit to delay a transition in the retimed phase select control signal by one-half of the period of the update clock signal based on the retimed phase select control signal crossing a boundary, to generate the delayed phase select control signal.

9. The system as claimed in claim 7, the delay modulation circuit to delay the retimed phase select control signal based on a second polarity of the retimed direction signal, to generate the delayed phase select control signal.

10. The system as claimed in claim 3, the step size signal to be set to a first polarity based on a change in the phase select control signal by a step size of one, and the step size signal to be set to a second polarity based on a change in the phase select control signal by a value greater than a step size of one.

11. The system as claimed in claim 10, the step size signal to change from a second polarity to a first polarity based on the phase select control signal crossing a boundary.

12. A method comprising:
    receiving a control code and an update clock signal;
    generating one or more control signals based on the control code and the update clock signal;
    retiming the one or more control signals based on the update clock signal to generate one or more retimed control signals;
    delaying the one or more retimed control signals based on the update clock signal and based on a predetermined condition, and generating a delayed clock select control signal and a delayed phase select control signal; and
    interpolating between two or more multi-phase clock signals, the interpolation based on the delayed clock select control signal and the delayed phase select control signal, the interpolation to generate an interpolated output clock.

13. The method as claimed in claim 12, the one or more control signals comprising a clock select control signal, a phase select control signal, a direction signal and a step size signal.

14. The method as claimed in claim 13, the one or more retimed control signals comprising a retimed clock select control signal, a retimed phase select control signal, a retimed direction signal and a retimed step size signal.

15. The method as claimed in claim 14, the delaying the one or more retimed control signals based on the update clock signal and based on a predetermined condition comprising delaying the retimed clock select control signal based on a first polarity of the retimed direction signal, to generate the delayed clock select control signal.

16. The method as claimed in claim 14, the delaying the one or more retimed control signals based on the update clock signal and based on a predetermined condition comprising delaying the retimed phase select control signal by one-half of the period of the update clock signal to generate the delayed phase select control signal.

17. The method as claimed in claim 14, the delaying the one or more retimed control signals based on the update clock signal and based on a predetermined condition comprising delaying a transition in the retimed clock select control signal by one-half of the period of the update clock signal based on the retimed phase select control signal crossing a boundary at a minimum value and based on a first polarity of the retimed direction signal.

18. The method as claimed in claim 14, the delaying the one or more retimed control signals based on the update clock signal and based on a predetermined condition comprising delaying a transition in the retimed clock select control signal by one-half of the period of the update clock signal based on the retimed phase select control crossing a boundary at a maximum value and based on a first polarity of the retimed direction signal.

19. The method as claimed in claim 14, the delaying the one or more retimed control signals based on the update clock signal and based on a predetermined condition comprising delaying a transition in the retimed phase select control signal by one-half of the period of the update clock signal based on the retimed phase select control signal crossing a boundary at a minimum value and based on a second polarity of the retimed direction signal.

20. The method as claimed in claim 14, the delaying the one or more retimed control signals based on the update clock signal and based on a predetermined condition comprising delaying a transition in the retimed phase select control signal by one-half of the period of the update clock signal based on the retimed phase select control signal crossing a boundary at a maximum value and based on a second polarity of the retimed direction signal.

21. The method as claimed in claim 13, the step size signal to be set to a first polarity based on a change in the phase select control signal by a step size of one, and the step size signal to be set to a second polarity based on a change in the phase select control signal by a value greater than a step size of one.

22. The method as claimed in claim 13, the step signal to change from a second polarity to a first polarity based on the phase select control signal reaching a boundary.

* * * * *